(12) United States Patent
Lee

(10) Patent No.: US 9,524,793 B1
(45) Date of Patent: Dec. 20, 2016

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/052,279

(22) Filed: Feb. 24, 2016

(30) Foreign Application Priority Data

Sep. 17, 2015 (KR) .................. 10-2015-0131721

(51) Int. Cl.
*G11C 11/34* (2006.01)
*G11C 16/04* (2006.01)
*G11C 16/34* (2006.01)
*G11C 16/10* (2006.01)

(52) U.S. Cl.
CPC ........... *G11C 16/3459* (2013.01); *G11C 16/10* (2013.01)

(58) Field of Classification Search
CPC .............................. G11C 16/3459; G11C 16/10
USPC .......................... 365/185.18, 185.23, 185.24
See application file for complete search history.

(56) References Cited

U.S. PATENT DOCUMENTS

| 7,170,788 | B1* | 1/2007 | Wan | G11C 11/5628 365/185.14 |
| 8,248,853 | B2* | 8/2012 | Lee | G11C 11/5628 365/185.17 |
| 8,456,918 | B2* | 6/2013 | Oh | G11C 16/10 365/185.02 |
| 8,638,608 | B2* | 1/2014 | Lai | G11C 11/5628 365/185.17 |
| 9,245,642 | B1* | 1/2016 | Chen | G11C 16/3427 |
| 9,330,777 | B2* | 5/2016 | Goda | G11C 16/3427 |
| 2004/0174748 | A1* | 9/2004 | Lutze | G11C 16/3418 365/185.28 |
| 2009/0147582 | A1* | 6/2009 | Aritome | G11C 16/0483 365/185.11 |
| 2013/0064029 | A1* | 3/2013 | Park | G11C 7/12 365/203 |
| 2013/0250688 | A1* | 9/2013 | Chen | G11C 11/5628 365/185.17 |
| 2014/0063974 | A1* | 3/2014 | Yang | G11C 16/0483 365/185.23 |
| 2015/0016189 | A1* | 1/2015 | Son | G11C 16/26 365/185.11 |

(Continued)

FOREIGN PATENT DOCUMENTS

| KR | 1020100095722 A | 9/2010 |
| KR | 1020150007397 A | 1/2015 |

*Primary Examiner* — Viet Q Nguyen
(74) *Attorney, Agent, or Firm* — William Park & Associates Ltd.

(57) ABSTRACT

There are provided a semiconductor memory device and an operating method thereof. A semiconductor memory device includes a memory cell array including a plurality of memory cells connected between a source select transistor and a drain select transistor, a peripheral circuit for performing a program operation on the memory cell array, and a control logic for controlling the peripheral circuit such that the potential level of a source control voltage applied to the source select transistor as a selected memory cell is closer to the drain select transistor in a program verify operation during the program operation.

17 Claims, 8 Drawing Sheets

(56) References Cited

U.S. PATENT DOCUMENTS

| | | | |
|---|---|---|---|
| 2015/0221374 A1* | 8/2015 | Lee .................. | G11C 16/10 365/185.11 |
| 2015/0221389 A1* | 8/2015 | Kim .................. | G11C 16/3445 365/185.17 |
| 2016/0099060 A1* | 4/2016 | Yoo .................. | G11C 16/10 365/185.11 |

* cited by examiner

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2015-0131721 filed on Sep. 17, 2015, in the Korean Intellectual Property Office, the entire disclosure of which is incorporated by reference herein.

BACKGROUND

1. Technical Field

An aspect of the present disclosure relates to an electronic device, and more particularly, to a semiconductor memory device and an operating method thereof.

2. Description of the Related Art

Semiconductor devices, particularly, semiconductor memory devices are generally classified into volatile memory devices and nonvolatile memory devices.

A non-volatile memory device performs a read/write operation at a relatively low speed, but retains stored data even when a power supply is cut off. Accordingly, the non-volatile memory device is used to store data to be retained regardless of a power supply. Examples of non-volatile memory devices are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are classified into NOR type flash memories and NAND type flash memories.

The flash memories have an advantage over RAM in which data is freely programmed and erased. Flash memories also have an advantage over ROM in which stored data is retained even when a power supply is cut off. The flash memories are widely used as a storage medium of portable electronic devices such as a digital camera, a personal digital assistant (PDA), and an MP3 player.

Flash memory may be classified into a two-dimensional semiconductor device and a three-dimensional semiconductor device each having a string vertically formed on a semiconductor substrate.

The three-dimensional semiconductor device is a memory device devised in order to overcome degree of integration limits found in two-dimensional semiconductor devices and includes a plurality of memory strings vertically formed on a semiconductor substrate. The memory strings include a drain select transistor, memory cells, and a source select transistor, connected in series between a bit line and a source line.

SUMMARY

Embodiments provide for a semiconductor memory device and an operating method thereof, which can improve the accuracy of a program verify operation.

According to an aspect of the present disclosure, there is provided a semiconductor memory device, including: a memory cell array configured to include a plurality of memory cells connected between a source select transistor and a drain select transistor; a peripheral circuit configured to perform a program operation on the memory cell array; and a control logic configured to control the peripheral circuit such that the potential level of a source control voltage applied to the source select transistor as a selected memory cell is closer to the drain select transistor in a program verify operation during the program operation.

According to an aspect of the present disclosure, there is provided a method of operating a semiconductor memory device, the method including: providing a plurality of memory cells connected between a source select transistor and a drain select transistor; and performing a program verify operation on a selected memory cell among the plurality of memory cells, wherein the potential level of a source control voltage applied to the source select transistor is increased as the selected memory cell is closer to the drain select transistor.

According to an aspect of the present disclosure, there is provided a method of operating a semiconductor memory device, the method including: providing a plurality of memory cells between a source line and a bit line; and performing a program verify operation on a selected memory cell among the plurality of memory cells, wherein the potential level of a source line voltage applied to the source line is decreased as the selected memory cell is closer to the drain select transistor.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, the element can be directly connected or coupled to the other element or be indirectly connected or coupled to the other element with one or more intervening elements interposed therebetween. In addition, when an element is referred to as "including" a component, this indicates that the element may further include another component instead of excluding another component unless it is disclosed otherwise.

Figure 1:
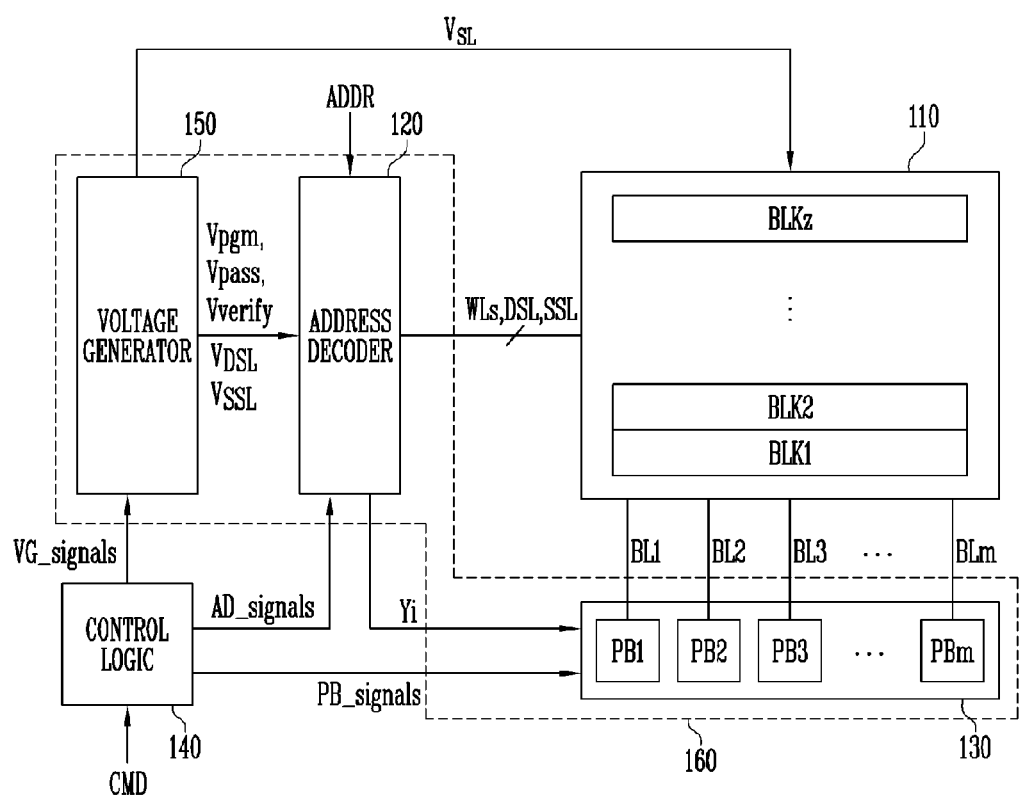
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through a plurality of word lines WLs, a drain select line DSL, and a source select line SSL. The plurality of memory blocks BLK1 to BLKz are connected to the read/write circuit 130 through bit lines BL1 to BLm. Each of the plurality of memory blocks BLK1 to BLKz includes a plurality of memory cells. In one embodiment, the plurality of memory cells are nonvolatile memory cells. More specifically, the plurality of memory cells may be charge trap device-based nonvolatile memory cells. In the plurality of memory cells, memory cells connected to a same word line are defined as one page. That is, the memory cell array 110 is configured with a plurality of pages. Each of the plurality of memory blocks BLK1 to BLKz in the memory cell array 110 includes a plurality of memory strings. Each of the plurality of memory strings includes a drain select transistor, a plurality of memory cells, and a source select transistor, which are connected in series between a bit line and a source line. In one example embodiment, the memory cell array 110 may include a plurality of memory cells connected between the source select transistor and the drain select transistor.

The address decoder 120, the read/write circuit 130, and the voltage generator 150 may each or in combination operate as peripheral circuits 160 for driving the memory cell array 110.

The address decoder 120 is connected to the memory cell array 110 through a plurality of word lines WLs, a drain select line DSL, and a source select line SSL. The address decoder 120 is configured to operate in response to control signals AD_signals output from the control logic 140. The address decoder 120 receives an address ADDR through an input/output buffer (not shown) in the semiconductor memory device 100.

The address decoder 120 applies a program voltage Vpgm, a pass voltage Vpass, a verify voltage Vverify, a drain control voltage $V_{DSL}$, and a source control voltage $V_{SSL}$ to the memory cell array 110 through the plurality of word lines WLs, the drain select line DSL, and the source select line SSL. The program voltage Vpgm, the pass voltage Vpass, the verify voltage Vverify, the drain control voltage $V_{DSL}$, and the source control voltage $V_{SSL}$ of the address decoder 120 may be generated by the voltage generator 150.

A program operation of the semiconductor memory device 100 is performed in page units, and may be sequentially performed according to a page address. For example, the program operation may be sequentially performed from a memory cell adjacent to the source select transistor to a memory cell adjacent to the drain select transistor. Alternatively, the program operation may be sequentially performed from a memory cell adjacent to the drain select transistor to a memory cell adjacent to the source select transistor. In one example, the peripheral circuit 160 may perform the program operation on the memory cell array 110.

An address ADDR received when the program operation is requested includes a block address, a row address, and a column address. The address decoder 120 selects one memory block BLK1 to BLKz and one word line WLs according to the block address and the row address. The column address Yi is decoded by the address decoder 120 to be provided to the read/write circuit 130.

The read/write circuit 130 includes a plurality of page buffers PB1 to PBm. The plurality of page buffers PB1 to PBm are connected to the memory cell array 110 through the bit lines BL1 to BLm. The plurality of page buffers PB1 to PBm temporarily store data DATA input in the program operation, and the plurality of page buffers PB1 to PBm control potentials of the respective corresponding bit lines BL1 to BLm according to the temporarily stored data. The plurality of page buffers PB1 to PBm sense currents and voltages of the respective corresponding bit lines BL1 to BLm in a program verify operation during the program operation, thereby performing the program verify operation.

The read/write circuit 130 operates in response to control signals PB_signals output from the control logic 140.

The control logic 140 is connected to the address decoder 120, the read/write circuit 130, and the voltage generator 150. The control logic 140 receives a command CMD through the input/output buffer (not shown) in the semiconductor memory device 100. The control logic 140 is configured to control overall operations of the semiconductor memory device 100 in response to commands CMD.

The control logic 140 controls the voltage generator 150 such that a potential level of the source control voltage $V_{SSL}$ or a source line voltage $V_{SL}$ is adjusted according to a position of a selected memory cell in the program verify operation during the program operation. Also, the potential level of the source control voltage $V_{SSL}$ and the source line voltage $V_{SL}$ may be adjusted together.

For example, the control logic 140 controls the voltage generator 150 to increase the potential level of the source control voltage $V_{SSL}$ as the selected memory cell in the program verify operation is more adjacent to, closer, or nearer the drain select transistor. The control logic 140 controls the voltage generator 150 to decrease the source line voltage $V_{SL}$ as the selected memory cell in the program verify operation is closer to the drain select transistor.

The voltage generator 150 operates in response to control signals VG_signals output from the control logic 140.

The voltage generator 150 generates a program voltage Vpgm applied to a selected word line in a program voltage applying operation and a pass voltage Vpass applied to unselected word lines in the program voltage applying operation. The voltage generator 150 generates a verify voltage Vverify applied to a selected word line in a program verify operation and a pass voltage Vpass applied to unselected word lines in the program verify operation. Also, the voltage generator 150 increases the potential level of the source control voltage $V_{SSL}$ as the selected memory cell in the program verify operation is closer to the drain select transistor, or decreases the potential level of the source line voltage $V_{SL}$ as the selected memory cell in the program verify operation is closer to the drain select transistor.

More specifically, the voltage generator 150 may gradually increase the source control voltage $V_{SSL}$ by a first offset voltage as the selected memory cell is closer to the drain select transistor and the voltage generator 150 may output the increased source control voltage $V_{SSL}$. In this case, the first offset voltage may be a voltage variable that varies inversely to a channel width of the selected memory cell. For example, as the channel width of the selected memory cell increases, the first offset voltage may decrease. When the channel width of the selected memory cell decreases, the first offset voltage may increase. Also, the voltage generator 150 may gradually decrease the source line voltage $V_{SL}$ by a second offset voltage when the selected memory cell is closer to the drain select transistor and output the decreased source line voltage $V_{SL}$. In this case, the second offset voltage may be a voltage variable that varies inversely to a channel width of the selected memory cell. For example, when the channel width of the selected memory cell increases, the second offset voltage may decrease. When the channel width of the selected memory cell decreases, the second offset voltage may increase.

Figure 2:
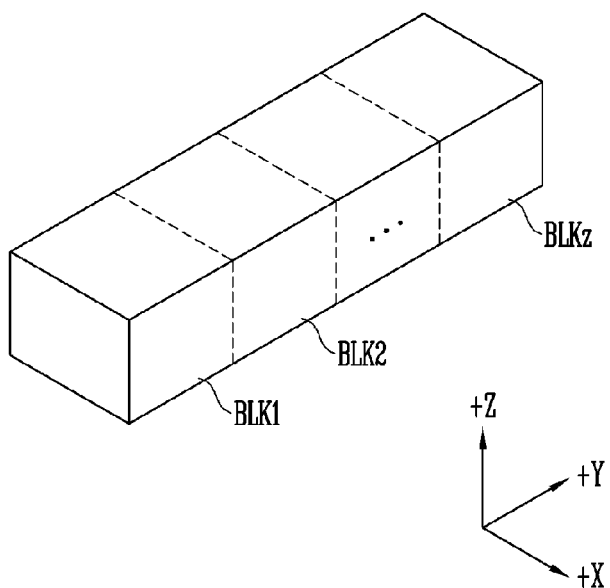
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block has a three-dimensional structure. Each memory block includes a plurality of memory cells stacked on a substrate. The plurality of memory cells are arranged along +X, +Y, and +Z directions. The structure of each memory block will be described in detail with reference to FIGS. 3 and 4.

Figure 3:
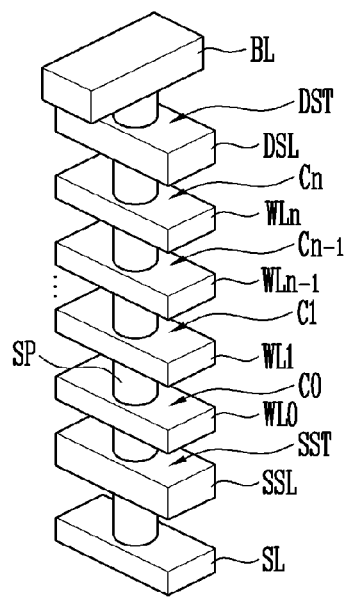
FIG. 3 is a three-dimensional view illustrating a memory string included in a memory block according to an embodiment of the present disclosure.
Figure 4:
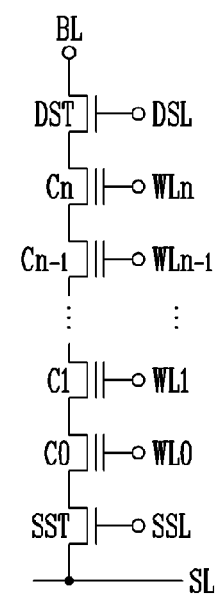
FIG. 4 is a circuit diagram illustrating the memory string shown in FIG. 3.

FIG. 3 is a three-dimensional view illustrating a memory string included in a memory block according to the embodiment of the present disclosure. FIG. 4 is a circuit diagram illustrating the memory string.

Referring to FIGS. 3 and 4, a source line SL is formed on a semiconductor substrate. A vertical channel layer SP is formed on the source line SL. The top of the vertical channel layer SP is coupled to a bit line BL. The vertical channel layer SP may be formed of polysilicon. A plurality of conductive layers SSL, WL0 to WLn, and DSL are formed to surround the vertical channel layer SP at different heights of the vertical channel layer SP. A multilayer ML including a charge storage layer is formed on a surface of the vertical channel layer SP. The multilayer ML is positioned between the vertical channel layer SP and the conductive layers SSL, WL0 to WLn, and DSL. The multilayer ML may be formed in an ONO structure in which an oxide layer, a nitride layer, and an oxide layer are sequentially laminated.

A lowermost conductive layer becomes a source select line SSL, and an uppermost conductive layer becomes a drain select line DSL. The conductive layers between the source select line SSL and the drain select line DSL become word lines WL0 to WLn. In other words, the conductive layers SSL, WL0 to WLn, and DSL are formed in a plurality of layers above the semiconductor substrate, and the vertical channel layer SP passing through the conductive layers SSL, WL0 to WLn, and DSL is vertically coupled between the bit line BL and the source line SL formed on the semiconductor substrate.

A drain select transistor DST is formed at a location where the uppermost conductive layer DSL surrounds the vertical channel layer SP. A source select transistor SST is formed at a location where the lowermost conductive layer SSL surrounds the vertical channel layer SP. Memory cells C0 to Cn are formed at locations where the intermediate conductive layers WL0 to WLn surround the vertical channel layer SP.

According to the above-described structure, a memory string includes the source select transistor SST, the memory cells C0 to Cn, and the drain select transistor DST. The memory string may be located between the source line SL and the bit line BL and may be vertically connected to the substrate. The source select transistor SST electrically connects the memory cells C0 to Cn to the source line SL according to a source control voltage applied to the source select line SSL. The drain select transistor DST electrically connects the memory cells C0 to Cn to the bit line BL according to a drain control voltage applied to the drain select line DSL. Further, the memory cell array 110 (see FIG. 1) may include a plurality of memory cells C0 to Cn connected between the source select transistor SST and the drain select transistor DST.

The vertical channel layer SP of the above-described memory string may have a structure in which a width of its upper portion is greater than that of its lower portion. For example, the channel width of the memory cell Cn is greater than that of the memory cell C0, and the channel width of a memory cell may increase the memory cell is closer to the drain select transistor DST.

Figure 5:
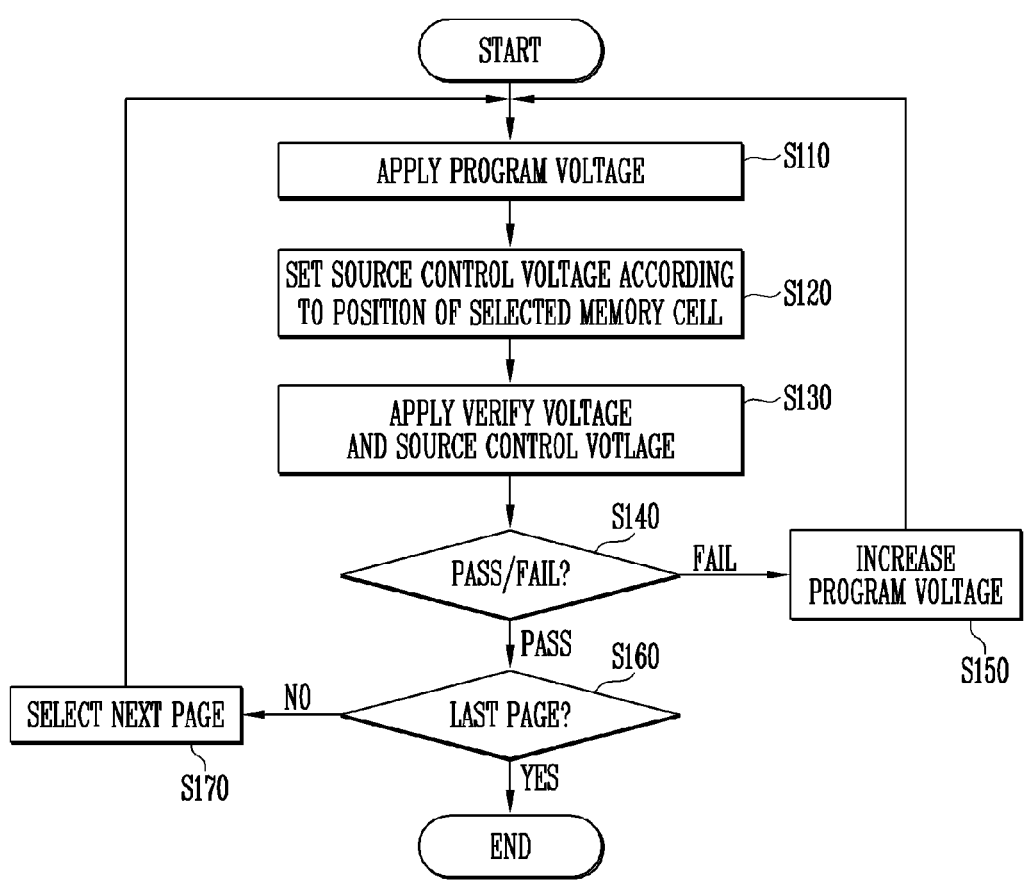
FIG. 5 is a flowchart illustrating operation of the semiconductor memory device according to an embodiment of the present disclosure.

FIG. 5 is a flowchart illustrating an operation of the semiconductor memory device according to an embodiment of the present disclosure.

An operating method of the semiconductor memory device according to an embodiment of the present disclosure will be described with reference to FIGS. 1 to 5.

1) Applying of Program Voltage (S110)

If a command CMD for a program operation of the semiconductor memory device is received at the control logic 140, the control logic 140 controls the read/write circuit 130 such that data DATA to be programmed, which is input from the outside, is temporarily stored in the plurality of page buffers PB1 to PBm. Each of the plurality of page buffers PB1 to PBm temporarily stores data DATA input in the program operation, and controls potentials of the respective corresponding bit lines BL1 to BLm according to the temporarily stored data.

The voltage generator 150 generates a program voltage Vpgm and a pass voltage Vpass under control of the control logic 140. In a program voltage applying operation, the address decoder 120 applies the program voltage Vpgm generated by the voltage generator 150 to a selected word line, and applies the pass voltage Vpass generated by the voltage generator 150 to the other word lines other than the selected word line.

2) Setting of Source Control Voltage According to Position of Selected Memory Cell (S120)

The control logic 140 sets a potential level of a source control voltage $V_{SSL}$ according to a position of a selected memory cell. For example, as the selected memory cell becomes closer to the drain select transistor DST, the control logic 140 increases the potential level of the source control voltage $V_{SSL}$. More specifically, if the potential level of the source control voltage $V_{SSL}$ is generally 6V, when the selected memory cell is the memory cell Cn adjacent to the drain select transistor DST, the potential level of the source control voltage $V_{SSL}$ is set to the highest value 6V, and the potential level of the source control voltage $V_{SSL}$ is gradually decreased as the selected memory cell becomes closer to the source select transistor SST. When the selected memory cell is the memory cell C0 closest to the source select transistor SST, the potential level of the source control voltage $V_{SSL}$ is set to the lowest value (e.g., 4V). As the selected memory cell becomes closer to the source select transistor SST, the source control voltage $V_{SSL}$ may be gradually decreased by a first offset voltage. The first offset voltage may vary according to a channel width of the selected memory cell. As the selected memory cell is closer to the drain select transistor DST, the channel width is gradually increased, and hence the first offset voltage may be gradually decreased.

3) Applying of Verify Voltage and Source Control Voltage (S130)

The read/write circuit 130 precharges the bit lines BL1 to BLm to a predetermined potential level. The voltage generator 150 generates a verify voltage Vverify, a pass voltage Vpass, a drain control voltage $V_{DSL}$, and a source control voltage $V_{SSL}$ under control of the control logic 140. In a program verify operation, the address decoder 120 applies the generated verify voltage Vverify and pass voltage Vpass respectively to at least a memory cell associated with the selected word line and the unselected word lines of the memory cell array 110. Also, the address decoder 120 applies the drain control voltage $V_{DSL}$ and the source control voltage $V_{SSL}$ respectively to the drain select line DSL and the source select line SSL of the memory cell array 110.

The amount of current flowing in the source line SL through the vertical channel layer SP of the memory string is adjusted according to a potential level of the source control voltage $V_{SSL}$ applied to the source select line. For example, the amount of current flowing in the source line SL for a program verify operation on a memory cell adjacent to the source select transistor SST or for a program verify operation on a memory cell adjacent to the drain select transistor DST may be uniformly controlled by adjusting the potential level of the source control voltage $V_{SSL}$.

After that, the read/write circuit 130 senses a change in potential level of the precharged bit lines BL1 to BLm, thereby performing a program verify operation on the memory cells.

4) Determining of Verify Result (S140)

As the result obtained by performing the program verify operation on the memory cells, the program operation on memory cells is determined as passed or failed, based on whether the memory cells connected to the selected word line is programmed to have a threshold voltage higher than the verify voltage Vverify or whether the threshold voltage of some or all of the memory cells is lower than the verify voltage Vverify.

5) Increasing of Program Voltage (S150)

When it is determined that the program operation on the memory cells failed as a result of determining the verify result (S140), the control logic 140 controls the voltage generator 150 to generate a new program voltage Vpgm by increasing the program Vpgm by a predetermined voltage, and the control logic 140 controls the peripheral circuits 160 to re-perform the operating method of applying the program voltage (S110) by using the new program voltage Vpgm.

6) Checking of Page Address (S160)

When the program operation on the memory cells is determined as passed as a result of determining the verify result (S140), the control logic 140 determines whether a currently selected page is the last page of the memory cell array 110. When the currently selected page is the last page of the memory cell array 110, the program operation is ended.

7) Selecting of Next Page (S170)

When it is determined by checking the page address that the selected page is not the last page (S160), the control logic 140 controls the peripheral circuits 160 to perform the method from the beginning by 10o applying of the program voltage (S110).

Figure 6:
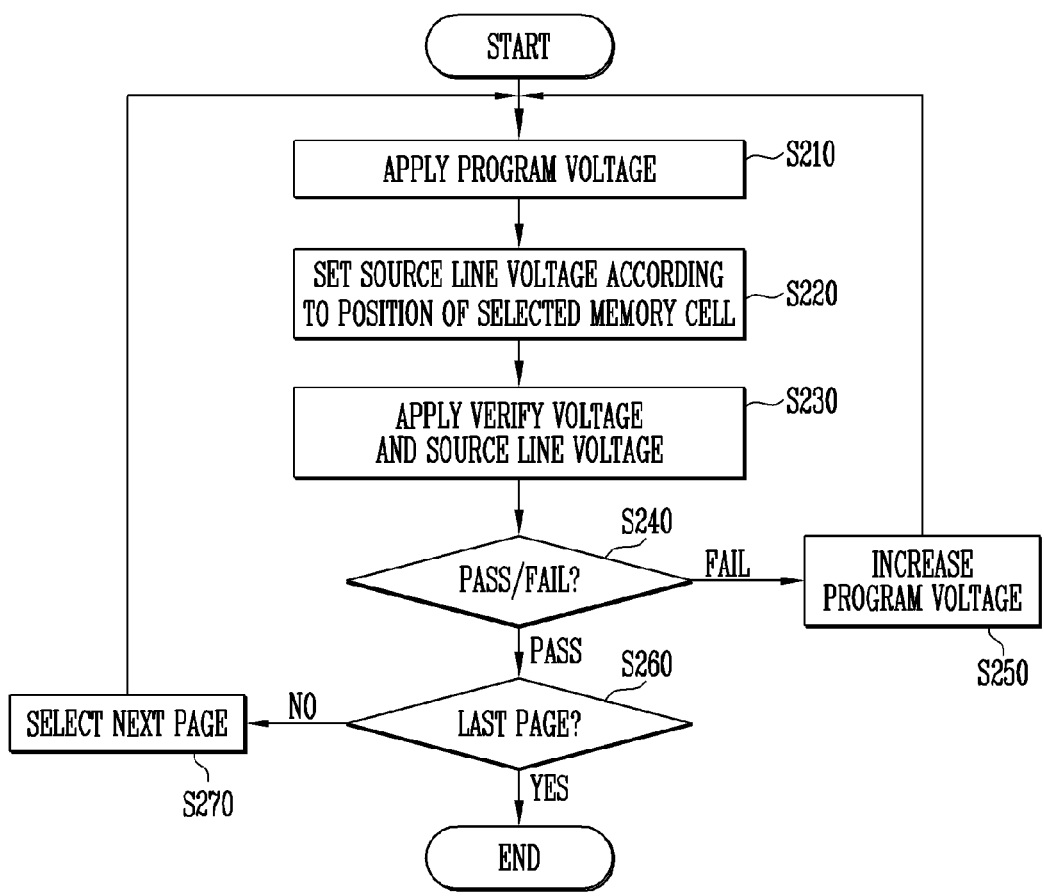
FIG. 6 is a flowchart illustrating operation of the semiconductor memory device according to another embodiment of the present disclosure.

FIG. 6 is a flowchart illustrating an operation of the semiconductor memory device according to another embodiment of the present disclosure.

An operating method of the semiconductor memory device according to another embodiment of the present disclosure will be described with reference to FIGS. 1 to 6.

1) Applying of Program Voltage (S210)

If a command CMD for a program operation of the semiconductor memory device is received by the control logic 140, the control logic 140 controls the read/write circuit 130 such that data DATA to be programmed is temporarily stored in the plurality of page buffers PB1 to PBm. Each of the plurality of page buffers PB1 to PBm temporarily stores data DATA input in the program operation, and controls potentials of the respective corresponding bit lines BL1 to BLm according to the temporarily stored data.

The voltage generator 150 generates a program voltage Vpgm and a pass voltage Vpass under control of the control logic 140. In a program voltage applying operation, the address decoder 120 applies the program voltage Vpgm generated by the voltage generator 150 to a selected word line, and applies the pass voltage Vpass generated by the voltage generator 150 to word lines other than the selected word line.

2) Setting of Source Line Voltage According to Position of Selected Memory Cell (S220)

The control logic 140 sets a potential level of a source line voltage $V_{SL}$ according to the position of a selected memory cell. For example, if the selected memory cell is closer to the drain select transistor DST, the control logic 140 decreases the potential level of the source line voltage $V_{SL}$. More specifically, if the potential level of the source line voltage $V_{SL}$ is generally is a ground voltage $V_{SS}$, when the selected memory cell is the memory cell Cn adjacent to the drain select transistor DST, the potential level of the source line voltage $V_{SL}$ is set to the ground voltage $V_{SS}$ as the lowest value, and the potential level of the source line voltage $V_{SL}$ is gradually increased as the selected memory cell becomes closer to the source select transistor SST. When the selected memory cell is the memory cell C0 adjacent to the source select transistor SST, the potential level of the source line voltage $V_{SL}$ is set to the highest value. As the selected memory cell becomes closer to the source select transistor SST, the source line voltage $V_{SL}$ may be gradually decreased by a second offset voltage. The second offset voltage may be varied according to a channel width of the selected memory cell. As the selected memory cell becomes closer to the drain select transistor DST, the channel width gradually increases, and hence the second offset voltage may gradually decrease.

3) Applying of Verify Voltage and Source Control Voltage (S230)

The read/write circuit 130 precharges the bit lines BL1 to BLm to a predetermined potential level. The voltage generator 150 generates a verify voltage Vverify, a pass voltage Vpass, a drain control voltage $V_{DSL}$, a source control voltage $V_{SSL}$, and a source line voltage $V_{SL}$ under control of the control logic 140. In a program verify operation, the address decoder 120 applies the generated verify voltage Vverify and the pass voltage Vpass respectively to at least a memory cell associated with the selected word line and the unselected word lines of the memory cell array 110. Also, the address decoder 120 applies the drain control voltage $V_{DSL}$ and the source control voltage $V_{SSL}$ respectively to the drain select line DSL and the source select line SSL of the memory cell array 110. The source line voltage $V_{SL}$ generated by the voltage generator 150 is applied to the source line SL of the memory cell array 110.

The amount of current flowing in the source line SL through the vertical channel layer SP of the memory string is adjusted according to a potential level of the source line voltage $V_{SL}$ applied to the source line in the program verify operation. For example, the amount of current flowing in the source line SL in the program verify operation on a memory cell adjacent to the source select transistor SST and the amount of current flowing in the source line SL in the program verify operation on a memory cell adjacent to the drain select transistor DST may be uniformly controlled by adjusting the potential level of the source line voltage $V_{SL}$.

After that, the read/write circuit 130 senses a change in a potential level of the precharged bit lines BL1 to BLm, thereby performing a program verify operation on the memory cells.

4) Determining of Verify Result (S240)

As the result obtained by performing the program verify operation on the memory cells, the program operation on memory cells is determined as pass or fail, based on whether the memory cells connected to the selected word line is programmed to have a threshold voltage higher than the verify voltage Vverify, or whether the threshold voltage of some or all of the memory cells is lower than the verify voltage Vverify.

5) Increasing of Program Voltage (S250)

When it is determined that the program operation on the memory cells failed as a result of determining the verify result (S240), the control logic 140 controls the voltage generator 150 to generate a new program voltage Vpgm by increasing the program Vpgm by a predetermined voltage, and the control logic 140 controls the peripheral circuits 160 to re-perform the operating method from of applying the program voltage (S210) by using the new program voltage Vpgm.

6) Determining of Page Address (S260)

When the program operation on the memory cells is determined as a pass as a result of determining the verify result (S240), the control logic 140 determines whether a currently selected page is the last page of the memory cell array 110. When the currently selected page is the last page in the memory cell array 110, the program operation is ended.

7) Select of Next Page (S270)

When the control logic 140 determines by checking the page address that the selected page is not the last page (S260), the control logic 140 controls the peripheral circuits 160 to perform the operating method from the applying of the program voltage (S210).

Figure 7:
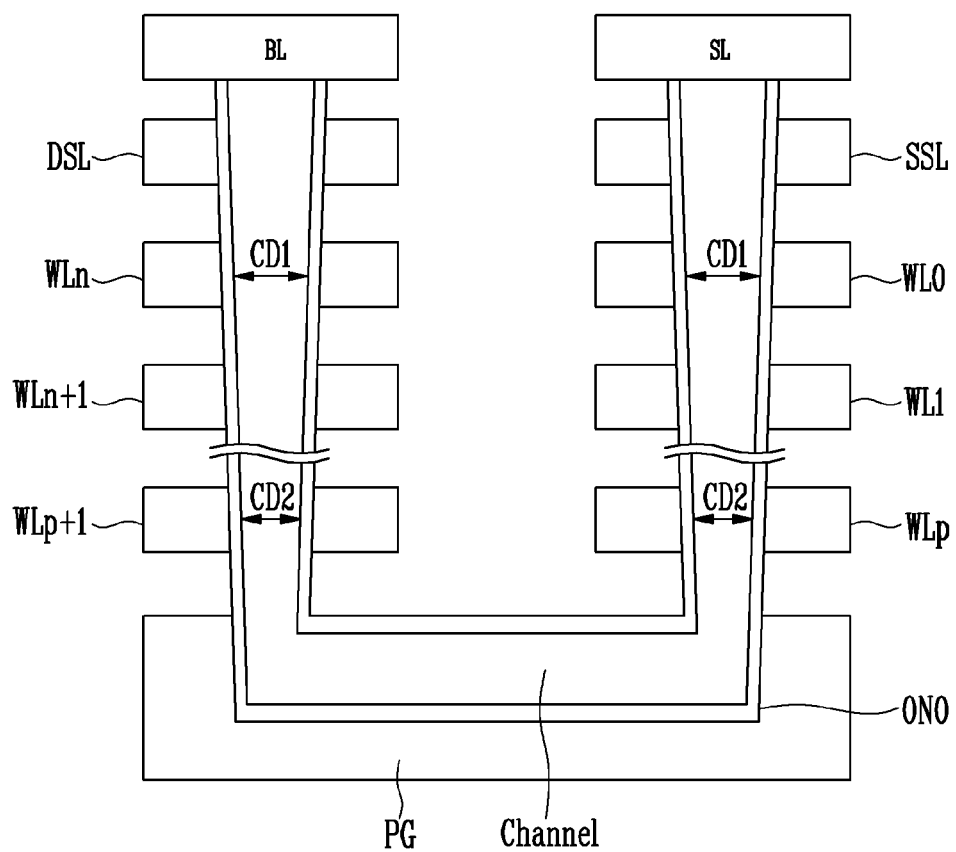
FIG. 7 is a sectional view illustrating a memory string according to another embodiment of the present disclosure.

FIG. 7 is a sectional view illustrating a memory string according to another embodiment of the present disclosure.

Referring to FIG. 7, the memory string may be formed into a structure having a U-shaped channel layer Channel. A bit line BL and a source line SL are connected to both end portions of the U-shaped channel layer Channel, respectively. In the U-shaped channel layer Channel, a portion formed in a pipe gate PG operates as a pipe transistor.

The memory string includes a plurality of word line layers WL0 to WLp and WLp+1 to WLn stacked along the U-shaped channel layer Channel on the pipe gate PG. Here, a drain select line DSL is formed at an end portion of the U-shaped channel layer Channel connected to the bit line BL, and a source select line SSL is formed at an end portion of the U-shaped channel layer Channel connected to the source line SL. Surfaces of the U-shaped channel layer Channel may be formed into a structure surrounding a memory layer ONO.

In a fabrication process of the U-shaped channel layer Channel, a U-shaped plug hole is formed by alternately stacking a plurality of material layers and then etching the stacked material layers, and a channel material is filled in the U-shaped plug hole. Therefore, in the process of forming the U-shaped plug hole, the critical dimension CD1 of opening of an upper hole is formed wider than the critical dimension CD2 of opening of a lower hole.

Figure 8:
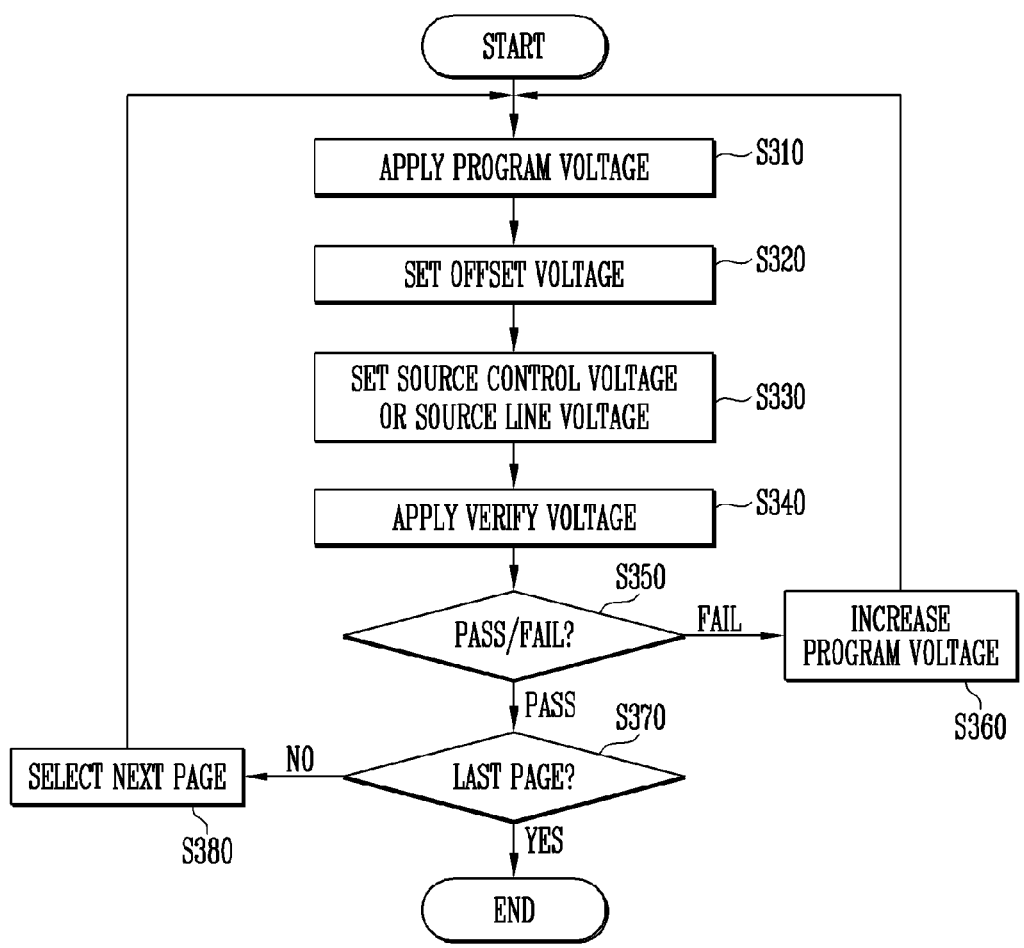
FIG. 8 is a flowchart illustrating operation of the semiconductor memory device according to yet another embodiment of the present disclosure.

FIG. 8 is a flowchart illustrating an operation of the semiconductor memory device according to still another embodiment of the present disclosure.

An operation of the semiconductor memory device according to an embodiment of the present disclosure will be described with respect to FIGS. 1, 7 and 8.

1) Applying of Program Voltage (S310)

If a command CMD for a program operation of the semiconductor memory device is received at the control logic 140, the control logic 140 controls the read/write circuit 130 such that data DATA to be programmed, which is input from the outside, is temporarily stored in the plurality of page buffers PB1 to PBm. Each of the plurality of page buffers PB1 to PBm temporarily stores the data DATA input in the program operation, and controls potentials of the respective corresponding bit lines BL1 to BLm according to the temporarily stored data.

The voltage generator 150 generates a program voltage Vpgm and a pass voltage Vpass under control of the control logic 140. In a program voltage applying operation, the address decoder 120 applies the program voltage Vpgm generated by the voltage generator 150 to a selected word line, and applies the pass voltage Vpass generated by the voltage generator 150 to word lines other than the selected word line.

2) Setting of Offset Voltage (S320)

The control logic 140 sets an offset voltage according to a channel width of a selected memory cell. For example, the control logic 140 may set the offset voltage such that the offset voltage is decreased when the channel width of the selected memory cell increases (e.g., CD1), and the offset voltage is increased when the channel width of the selected memory cell decreases (e.g., CD2). In a program verify operation, the control logic 140 increases the offset voltage as the selected memory cell is closer to the pipe gate PG, and decreases the offset voltage because the selected memory cell is closer to the source select transistor or the drain select transistor.

3) Setting of Source Control Voltage or Source Line Voltage (S330)

The control logic 140 sets a potential level of the source control voltage $V_{SSL}$ or the source line voltage $V_{SL}$ by using the position of the selected memory cell and the offset voltage set in step S320. For example, when the source control voltage $V_{SSL}$ is set, like step S120, the control logic 140 increases the potential level of the selected memory cell because the selected memory cell is closer to the drain select transistor DST. In this state, the source control voltage $V_{SSL}$ is set by adjusting an increase in the potential level of the source control voltage $V_{SSL}$, which reflects the offset voltage. When the source line voltage $V_{SL}$ is set, like step S220, the control logic 140 decreases the potential level of the selected memory cell because the selected memory cell is closer to the drain select transistor DST. In this state, the source line voltage $V_{SL}$ is set by adjusting a decrease in the potential level of the source line voltage $V_{SL}$, which reflects the offset voltage.

In the above-described step, the source control voltage $V_{SSL}$ and the source line voltage $V_{SL}$ may be adjusted together according to the position of the selected memory cell and the offset voltage.

4) Applying of Verify Voltage and Source Control Voltage (S340)

The read/write circuit 130 precharges the bit lines BL1 to BLm to a predetermined potential level. The voltage generator 150 generates a verify voltage Vverify, a pass voltage Vpass, a drain control voltage $V_{DSL}$, a source control voltage $V_{SSL}$, and a source line voltage $V_{SL}$ under control of the control logic 140. In a program verify operation, the address decoder 120 applies the verify voltage Vverify and the pass voltage Vpass respectively to at least a memory cell associated with the selected word line and the unselected word lines of the memory cell array 110. Also, the address decoder 120 applies the drain control voltage $V_{DSL}$ and the source control voltage $V_{SSL}$ respectively to the drain select line DSL and the source select line SSL of the memory cell array 110. The source line voltage $V_{SL}$ generated by the voltage generator 150 is applied to the source line SL of the memory cell array 110.

The amount of current flowing in the source line SL through the channel layer of the memory string is adjusted according to a potential level of the source control voltage $V_{SSL}$ applied to the source select line SSL or a potential level of the source line voltage $V_{SL}$ applied to the source line SL in the program verify operation. For example, the amount of current flowing in the source line SL in a program verify operation on a memory cell adjacent to the source select transistor SST and the amount of current flowing in the source line SL in the program verify operation on a memory cell adjacent to the drain select transistor DST may be uniformly controlled by adjusting the potential level of the source control voltage $V_{SSL}$ or the potential level of the source line voltage $V_{SL}$. Also, a difference in the amount of current according to the channel width of the memory string is corrected by using the offset voltage, so that the amount of current flowing in the source line SL according to the either a potential level of the source control voltage $V_{SSL}$ or source line voltage $V_{SL}$ can be more uniformly controlled.

After that, the read/write circuit 130 senses a change in a potential level of the precharged bit lines BL1 to BLm, thereby performing a program verify operation on the memory cells.

5) Determining of Verify Result (S350)

As the result obtained by performing the program verify operation on the memory cells, the program operation on memory cells is determined as a pass or fail, based on whether the memory cells connected to the selected word line is programmed to have a threshold voltage higher than the verify voltage Vverify or whether the threshold voltage of some or all of the memory cells is lower than the verify voltage Vverify.

6) Increasing of Program Voltage (S360)

When the program operation on the memory cells fails as the result of determining the verify result (S350), the control logic 140 controls the voltage generator 150 to generate a new program voltage Vpgm by increasing the program Vpgm a predetermined voltage, and controls the peripheral circuits 160 to re-perform the operating method from step of applying of the program voltage (S310) by using the new program voltage Vpgm.

7) Checking of Page Address (S370)

When the program operation on the memory cells passes as a result of determining the verify result (S350), the control logic 140 determines whether a currently selected page is the last page of the memory cell array 110. When it is determined that the selected page is the last page, the program operation is ended.

8) Selecting of Next Page (S380)

When the selected page is not the last page obtained by checking the page address (S370), the control logic 140 controls the peripheral circuits 160 to perform the operating method from the step of applying of the program voltage (S310).

Figure 9:
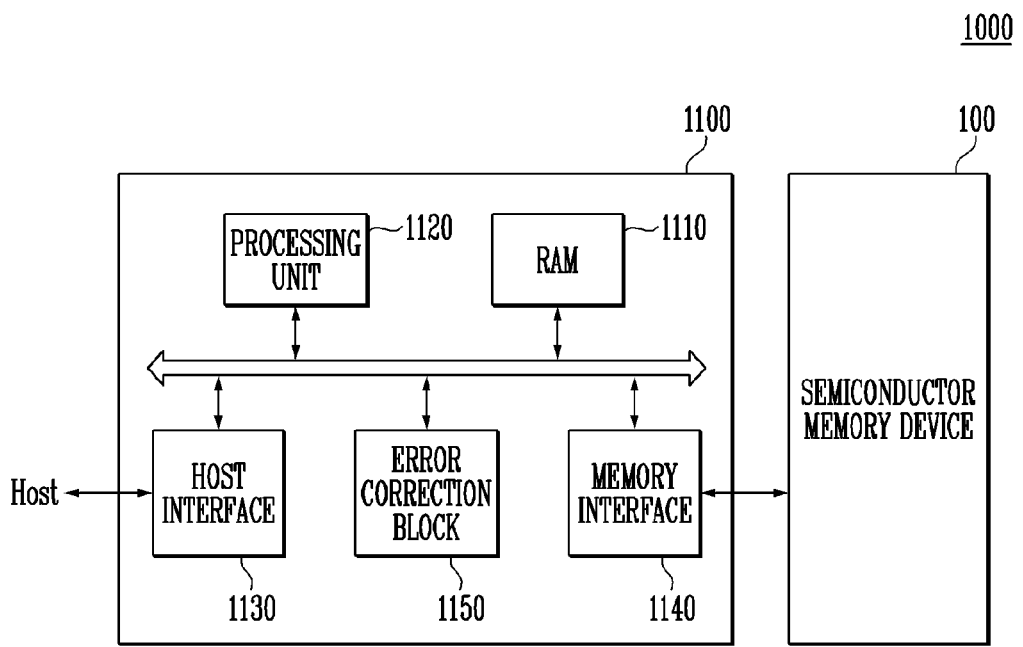
FIG. 9 is a block diagram illustrating a memory system including the semiconductor memory device of FIG. 1.

FIG. 9 is a block diagram illustrating a memory system including the semiconductor memory device of FIG. 1.

Referring to FIG. 9, the memory system 1000 includes a semiconductor memory device 100 and a controller 1100.

The semiconductor memory device 100 may be configured and operate as described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls overall operations of the controller 1100. Also, the controller 1100 may arbitrarily store program data provided from the host Host when a read operation is performed.

The host interface 1130 includes a protocol for exchanging data between the host Host and the controller 1100. As an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correcting block 1150 is configured to detect and correct an error of data received from the semiconductor memory device 100 by using an error correction code (ECC). The processing unit 1120 may adjust a read voltage based on an error detection result of the error correcting block 1150, and control the semiconductor memory device 100 to perform a re-read operation. As an exemplary embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host connected to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
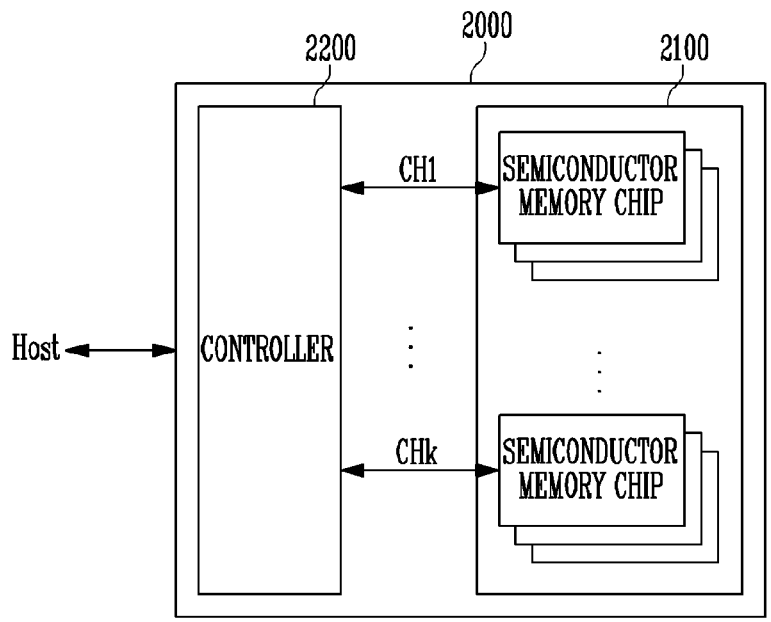
FIG. 10 is a block diagram illustrating an application example of the memory system of FIG. 9.

FIG. 10 is a block diagram illustrating an application example of the memory system of FIG. 9.

Referring to FIG. 10, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 10, it is illustrated that the plurality of groups communicate with the controller 2200 through first to kth channels CH1 to CHk. Each semiconductor memory chip may be configured and operated like the semiconductor memory device 100 described with reference to FIG. 1.

Each group is configured to communicate with the controller 2200 through one common channel. The controller 2200 is configured similar to the controller 1100 described with reference to FIG. 8. The controller 2200 is configured to control the plurality of memory chips of 10*o* the semiconductor memory device 2100 through the plurality of channels CH1 to CHk.

Figure 11:
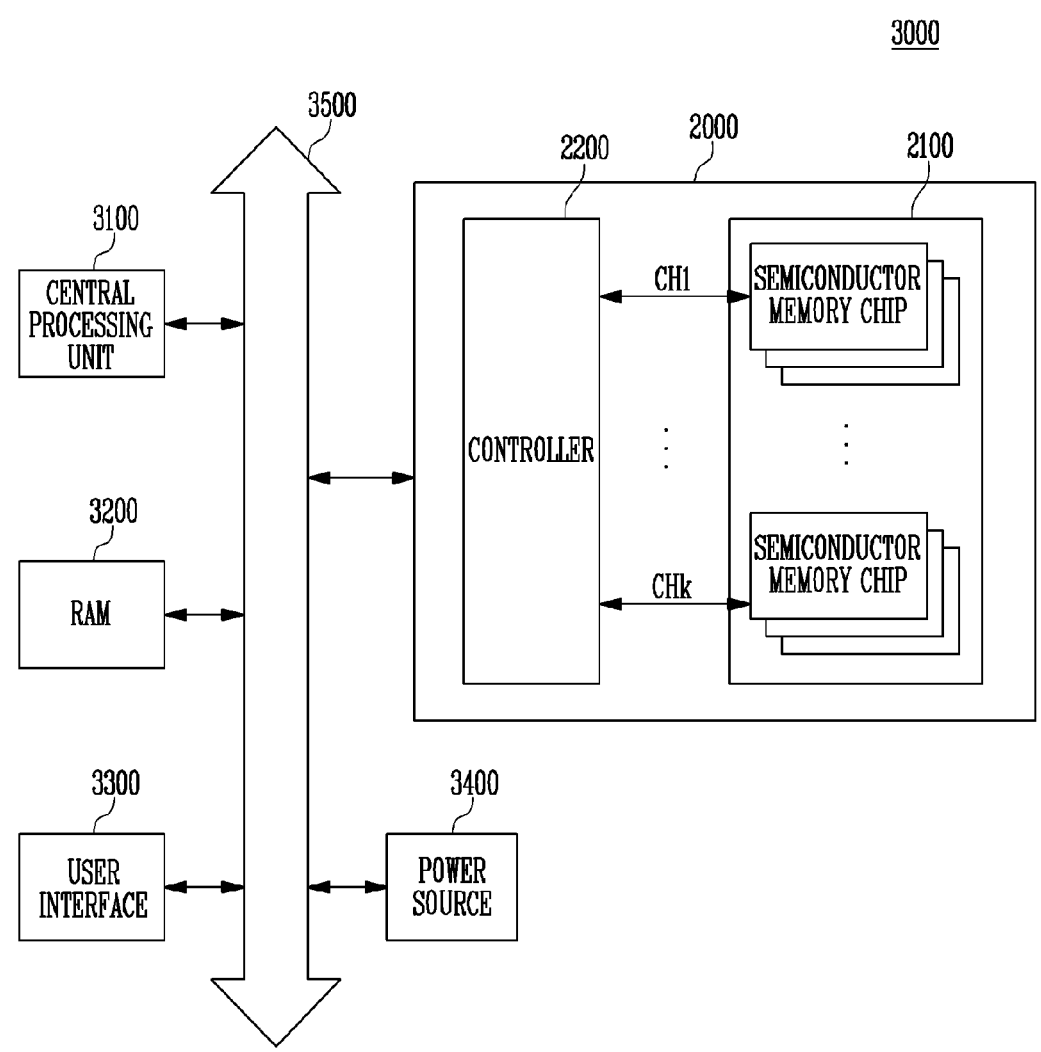
FIG. 11 is a block diagram illustrating a computing system including the memory system described with reference to FIG. 10.

FIG. 11 is a block diagram illustrating a computing system including the memory system described with reference to FIG. 10.

Referring to FIG. 11, the computing system 3000 includes a central processing unit 3100, a RAM 3200, a user interface 3300, a power source 3400, a system bus 3500, and a memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 11, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 11, it is illustrated that the memory system 2000 described with reference to FIG. 10 is provided. However, the memory system 2000 may be replaced by the memory system 1000 described with reference to FIG. 9. As an exemplary embodiment, the computing system 3000 may be configured to include both the memory systems 1000 and 2000 described with reference to FIGS. 9 and 10.

According to the present disclosure, in a program verify operation of the semiconductor memory device, the amount of current flowing in the source is uniformly controlled, thereby improving the accuracy of the program verify operation. Accordingly, it is possible to improve a distribution of threshold voltages of memory cells in the semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
    a memory cell array configured to include a plurality of memory cells connected between a source select transistor and a drain select transistor;
    a peripheral circuit configured to perform a program operation on the memory cell array; and
    a control logic configured to control the peripheral circuit such that the potential level of a source control voltage applied to the source select transistor is increased by a first offset voltage as a selected memory cell is closer to the drain select transistor in a program verify operation during the program operation,
wherein the first offset voltage is a voltage variable according to a channel width of the selected memory cell.

2. The semiconductor memory device of claim 1, wherein the peripheral circuit includes a voltage generator configured to apply a verify voltage to the selected memory cell and apply the source control voltage to the source select transistor in the program verify operation.

3. The semiconductor memory device of claim 1, wherein as the channel width increases, the first offset voltage is decreased, and as the channel width decreases, the first offset voltage is increased.

4. The semiconductor memory device of claim 1, wherein the control logic controls the peripheral circuit such that the potential level of a source line voltage applied to a source line of the memory cell array is decreased as the selected memory cell is closer to the drain select transistor in the program verify operation.

5. The semiconductor memory device of claim 4, wherein the peripheral circuit includes a voltage generator configured to apply a verify voltage to the selected memory cell and apply the source line voltage to the source line in the program verify operation,
wherein the voltage generator generates the source line voltage decreased by a second offset voltage as the selected memory cell is closer to the drain select transistor, and applies the generated source line voltage to the source line.

6. The semiconductor memory device of claim 5, wherein the second offset voltage is a voltage variable according to a channel width of the selected memory cell, and
wherein as the channel width increases, the second offset voltage is decreased, and as the channel width decreases, the second offset voltage is increased.

7. The semiconductor memory device of claim 1, wherein the plurality of memory cells are divided into a plurality of memory groups, and the control logic controls the peripheral circuit such that the source control voltage is increased as a memory group including the selected memory cell is closer to the drain select transistor.

8. A method of operating a semiconductor memory device, the method comprising:
providing a plurality of memory cells connected between a source select transistor and a drain select transistor; and
performing a program verify operation on a selected memory cell among the plurality of memory cells,
wherein the potential level of a source control voltage applied to the source select transistor is increased by a first offset voltage as the selected memory cell is closer to the drain select transistor,
wherein the first offset voltage is a voltage variable according to a channel width of the selected memory cell.

9. The method of claim 8, wherein, as the channel width of the selected memory cell increases, the first offset voltage is decreased, and as the channel width of the selected memory cell decreases, the first offset voltage is increased.

10. The method of claim 8, wherein, when the program verify operation is performed, a source line voltage is applied to a source line connected to the source select transistor.

11. The method of claim 10, wherein the potential level of the source line voltage is decreased as the selected memory cell is closer to the drain select transistor.

12. The method of claim 11, wherein the source line voltage is gradually decreased by a second offset voltage as the selected memory cell is closer to the drain select transistor.

13. The method of claim 12, wherein, as the channel width of the selected memory cell increases, the second offset voltage is decreased, and as the channel width of the selected memory cell decreases, the second offset voltage is increased.

14. A method of operating a semiconductor memory device, the method comprising:
providing a plurality of memory cells between a source line and a bit line; and
performing a program verify operation on a selected memory cell among the plurality of memory cells,
wherein the potential level of a source line voltage applied to the source line is decreased by a first offset voltage as the selected memory cell is closer to the drain select transistor,
wherein the first offset voltage is a voltage variable according to a channel width of the selected memory cell.

15. The method of claim 14, wherein, as the channel width of the selected memory cell increases the first offset voltage is decreased, and as the channel width of the selected memory cell decreases the first offset voltage is increased.

16. The method of claim 14, wherein the potential level of a source control voltage applied to a source select transistor is increased as the selected memory cell is closer to the drain select transistor.

17. The method of claim 16, wherein the source control voltage is gradually increased by a second offset voltage as the selected memory cell is closer to the drain select transistor.

* * * * *